United States Patent
Morita et al.

(10) Patent No.: US 7,736,998 B2
(45) Date of Patent: Jun. 15, 2010

(54) SILICON-ON INSULATOR SUBSTRATE AND METHOD FOR MANUFACTURING THE SAME

(75) Inventors: Etsurou Morita, Tokyo (JP); Ritarou Sano, Tokyo (JP); Akihiko Endo, Tokyo (JP)

(73) Assignee: Sumco Corporation, Tokyo (JP)

( * ) Notice: Subject to any disclaimer, the term of this patent is extended or adjusted under 35 U.S.C. 154(b) by 788 days.

(21) Appl. No.: 11/597,027

(22) PCT Filed: May 25, 2005

(86) PCT No.: PCT/JP2005/009565

§ 371 (c)(1),
(2), (4) Date: Nov. 17, 2006

(87) PCT Pub. No.: WO2005/117123

PCT Pub. Date: Dec. 8, 2005

(65) Prior Publication Data

US 2008/0063840 A1    Mar. 13, 2008

(30) Foreign Application Priority Data

May 28, 2004    (JP) .............................. 2004-159398

(51) Int. Cl.
*H01L 21/30* (2006.01)
(52) U.S. Cl. ....................... 438/459; 438/455; 438/458; 438/479; 438/528
(58) Field of Classification Search .................. 438/455, 438/458–459, 479, 528
See application file for complete search history.

(56) References Cited

U.S. PATENT DOCUMENTS

| 5,863,829 | A | | 1/1999 | Nakayoshi et al. |
| 6,103,009 | A | * | 8/2000 | Atoji ........................... 117/97 |
| 6,140,210 | A | | 10/2000 | Aga et al. |
| 6,210,593 | B1 | * | 4/2001 | Ohkuni et al. ................ 216/59 |
| 6,331,473 | B1 | * | 12/2001 | Hirabayashi ................ 438/455 |
| 7,084,046 | B2 | * | 8/2006 | Mitani et al. ................ 438/459 |
| 7,245,330 | B2 | * | 7/2007 | Katayama .................... 349/43 |

(Continued)

FOREIGN PATENT DOCUMENTS

JP    09-064321    3/1997

(Continued)

OTHER PUBLICATIONS

International Search Report for PCT/JP2005/009565 dated Sep. 6, 2005.

(Continued)

*Primary Examiner*—Kevin M Picardat
*Assistant Examiner*—Bac H Au
(74) *Attorney, Agent, or Firm*—Kolisch Hartwell, PC (57) ABSTRACT

This SOI substrate includes a base substrate which includes a single-crystal semiconductor and an active layer which includes a single-crystal semiconductor and is bonded to the base substrate with an oxide film therebetween. The oxide film is formed only in the active layer. The active layer is formed with a thickness of 10 to 200 nm and a thickness variation throughout the active layer of 1.5 nm or less by etching a surface of the active layer while selectively using only the reactive radicals generated by a plasma etching process.

7 Claims, 3 Drawing Sheets

U.S. PATENT DOCUMENTS

2003/0181001 A1  9/2003  Aga et al.

FOREIGN PATENT DOCUMENTS

| JP | H09-115887 | 5/1997 |
| JP | 09-260620 | 10/1997 |
| JP | 11-102848 | 4/1999 |
| WO | WO03/009386 A1 | 1/2003 |

OTHER PUBLICATIONS

Written Opinion for PCT/JP2005/009565 dated Sep. 6, 2005.
A Chinese Office Action from corresponding Chinese Patent Application No. 200580025175.7, issued on May 9, 2008, and its English language translation.

* cited by examiner

SILICON-ON INSULATOR SUBSTRATE AND METHOD FOR MANUFACTURING THE SAME

TECHNICAL FIELD

The present invention relates to a silicon-on-insulator (SOI) substrate which includes an oxide layer produced using a hydrogen ion implantation technique and an active layer provided on the oxide layer. The present invention also relates to a method for manufacturing such an SOI substrate.

This application claims priority from Japanese Patent Application No. 2004-159398, filed on May 28, 2004, the content of which is incorporated herein by reference.

BACKGROUND ART

A method for manufacturing SOI wafers has hitherto been disclosed in which, first, an oxide film is formed on at least one of two silicon wafers and a microbubble layer (trap layer) is formed at the interior of one of the silicon wafers by implanting hydrogen ions or rare-gas ions from the upper surface of the wafer. Next, the ion implanted surface of this wafer is brought into contact with the other wafer such that the oxide film is disposed therebetween, then heat treatment is applied; thereby splitting the first wafer into thin films at the microbubble layer as the cleavage plane (e.g., see Patent Document 1). In this SOI wafer manufacturing process, examples of techniques for removing the defect layer at the cleavage plane in the resulting SOI wafer include chemical mechanical polishing (CMP) method, sacrificial oxidation method involving heat treatment in an oxygen atmosphere to oxidize the near-surface region, and a gas-phase etching process known as plasma-assisted chemical etching (PACE). The PACE process is carried out with a pair of electrodes arranged on either side (above and below) the SOI wafer, a radio-frequency power supply that applies radio-frequency waves between the electrodes, and a cavity which is provided on one electrode opposite the SOI wafer and is capable of traveling freely over the SOI wafer. A plasma is localized and generated within the cavity, the plasma being used to etch the active layer. In order to etch the active layer using the PACE process, first the thickness distribution of the active layer on the SOI wafer is measured, then the velocity of travel by the cavity is controlled in accordance with this thickness distribution. In this way, the length of time during the active layer is exposed to the plasma is controlled, the crystal defect layer at the surface of the active layer can be removed while making the thickness of the active layer uniform.

However, in the SOI wafer manufacturing process described in Patent Document 1, the plasma generated within the cavity contains not only reactive radicals which do not cause any damage to the active layer, but also reactive ions which damage the active layer. Because these reactive ions are used as part of the etchant for etching the surface of the active layer, they end up causing damage to the active layer.

As for the CMP method and the sacrificial oxidation method, because both processes thin the entire surface at the same time, they cannot improve the in-plane uniformity in the thickness of the active layer. Also, the amount of thinning is not everywhere uniform in-plane, there being some variation in the initial in-plane thickness, which may have the opposite effect of degrading the in-plane uniformity.

Moreover, in the SOI wafer manufacturing process described in Patent Document 1, because the wafer shape is thinner at the periphery, bonding up to the vicinity of the wafer edge does not occur; thereby, an inactive region (1 to 2 mm in width) called the "terrace region" exists. The boundary line between the inactive region and the active region is often irregular rather than smooth. In particular, very small active regions which are isolated in the manner of islands or which jut out as peninsulas in the inactive region (terrace) have been a cause of particle generation.

Patent Document 1: Japanese Unexamined Patent Application, First Publication No. H11-102848 (Claim 1 and Paragraphs [0016], [0021] and [0030])

DISCLOSURE OF THE INVENTION

Problems to be Solved by the Invention

It is therefore an object of the invention to provide a SOI substrate in which the crystal defect layer at the surface of the active layer can be removed and in which the thickness variation throughout the active layer can be reduced and the thickness of the active layer rendered uniform without damaging the surface of the active layer. Another object of the invention is to provide a process for manufacturing such a SOI substrate.

A further object of the invention is to provide a SOI substrate in which particle generation can be suppressed by smoothing the boundary line between an inactive region and an active region at the periphery of a bonded substrate. A yet further object of the invention is to provide a process for manufacturing such a SOI substrate.

Means for Solving the Problems

The SOI substrate of the present invention is an improvement of a SOI substrate having a base substrate which includes a single-crystal semiconductor and an active layer which includes a single-crystal semiconductor and is bonded to the base substrate with an oxide film therebetween.

The SOI substrate of the present invention is characterized in that the oxide film is formed only in the active layer, and the active layer is formed with a thickness of 10 to 200 nm and a thickness variation throughout the active layer of 1.5 nm or less by etching a surface of the active layer while selectively using only the reactive radicals generated by a plasma etching process.

In this SOI substrate, because the surface of the active layer has been etched by selectively using only the reactive radicals generated by a plasma etching process, the thickness variation in the active layer can be reduced and the active layer thickness made more uniform without damaging the surface of the active layer.

In this specification, the term 'throughout' in the phrase "thickness variation throughout the active layer" refers to portions of the active layer other than the contoured edge at the periphery of the active layer.

The method for manufacturing a silicon-on-insulator (SOI) substrate of the present invention includes: forming an oxide film in at least a surface of an active layer-forming substrate including a single-crystal semiconductor; implanting hydrogen ions from the surface of the active layer-forming substrate so as to form an ion-implanted region within the active layer-forming substrate; subjecting the active layer-forming substrate to a first heat treatment in a state in which the active layer-forming substrate contacts, through the oxide film, with a base substrate including a single-crystal semiconductor so as to separate the active layer-forming substrate from the base substrate at the ion-implanted region and form an active layer on a surface of the base substrate, thereby, forming a bonded substrate; measuring film thickness throughout the active layer; selectively using only reactive radicals generated by a plasma etching process to etch a lot of material in areas where the active layer has a large thickness and etch a little material in areas where the active layer has a small thickness in such a way as to etch off at least 100 nm of the active layer and thin the active layer to a predetermined thickness; and subject the plasma-etched bonded substrate to a second heat treatment so as to enhance the bond strength.

In this method for manufacturing a SOI substrate, because only reactive radicals generated by a plasma etching process are selectively used to etch the surface of the active layer in accordance with thickness variations in the active layer, the surface of the active layer, i.e., the crystal defect layer at the splitting plane in the ion-implanted region due to the first heat treatment, can be removed and the thickness variation in the active layer can be reduced to provide a more uniform active layer thickness without damaging the surface of the active layer.

This method for manufacturing a SOI substrate may further include additionally plasma etching, regardless of the active layer thickness measurement data, a boundary area between an inactive region and an active region at the periphery of the bonded substrate by a thickness equal to that of the active layer prior to plasma etching based on film thickness measurement data.

Here, by adding a step in which a boundary area between an inactive region and an active region at the periphery of the bonded substrate is additionally plasma-etched, the boundary line between the inactive region and the active region can be rendered smooth; thereby, particle generation suppressed, without increasing the number of processing operations.

ADVANTAGEOUS EFFECTS OF THE INVENTION

In accordance with the present invention, because the oxide film is formed only in the active layer, and because the active layer is formed with a thickness of 10 to 200 nm and a thickness variation throughout the active layer of 1.5 nm or less by selectively using only the reactive radicals generated by a plasma etching process to etch a surface of the active layer, it is possible to reduce the variation in the active layer thickness and make the active layer thickness more uniform without damaging the surface of the active layer.

Also, hydrogen ions are implanted from the surface of an active layer-forming substrate on at least the surface of which an oxide film has been formed, thereby creating an ion-implanted region within the active layer-forming substrate; a bonded substrate is produced by subjecting the active layer-forming substrate to a first heat treatment in a state in which the active layer-forming substrate contact, through the oxide film, with a base substrate, so as to split the active layer-forming substrate from the base substrate at the ion-implanted region and form an active layer on a surface of the base substrate; film thickness measurements are taken throughout the active layer; only reactive radicals generated by a plasma etching process are selectively used to etch the surface of the active layer and thereby thin the active layer to a predetermined thickness; and then the bonded substrate is subjected to a second heat treatment. In this way, it is possible to both remove the crystal defect layer at the surface of the active layer and also to reduce the thickness variation in the active layer so as to provide a more uniform active layer thickness without damaging the surface of the active layer.

Moreover, by adding to the above etching process, a step in which, regardless of the active layer thickness measurement data, a boundary area between an inactive region and an active region at the periphery of the bonded substrate is additionally plasma-etched, the boundary line between the inactive region and the active region can be rendered smooth without increasing the number of processing operations. As a result, particle generation can be suppressed.

EXPLANATION OF THE SYMBOLS

11: SOI substrate, 12: Base substrate, 13: Active layer, 14: Active layer-forming substrate, 16: Ion-implanted region, 17: Thick area, 18: Bonded substrate, 21: First oxide film, 22: Second oxide film, 28: Reactive radicals, 31: Boundary area between inactive region and active region

BEST MODE FOR CARRYING OUT THE INVENTION

The best mode for carrying out the present invention is described in conjunction with the accompanying diagrams.

Figure 1:
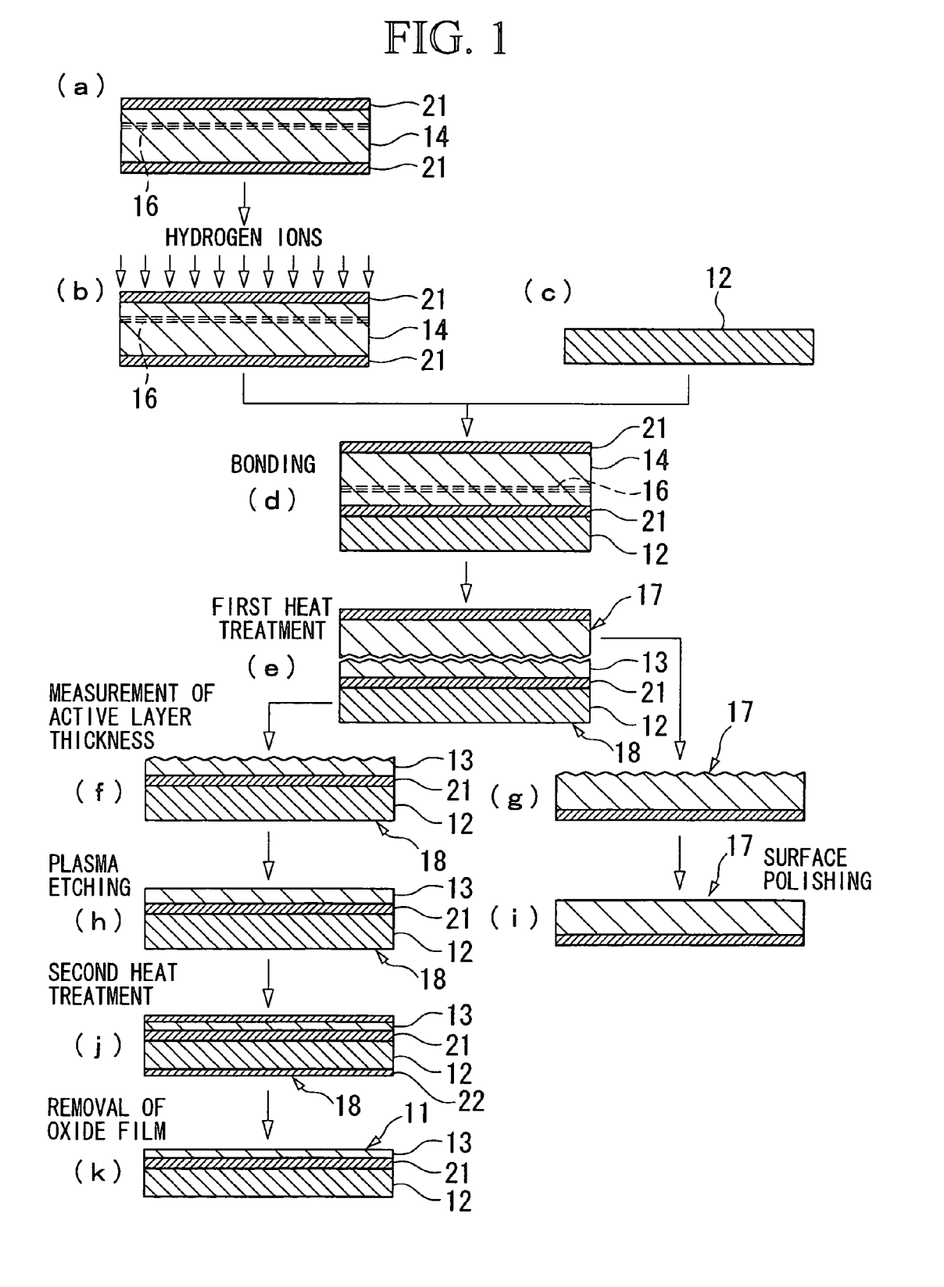
FIG. 1 shows the sequence of steps in a method for manufacturing a SOI substrate in accordance with an embodiment of the present invention.

Referring to FIG. 1, a silicon-on-insulator (SOI) substrate 11 has a base substrate 12 which includes a single-crystal semiconductor wafer, and an active layer 13 which includes a single-crystal silicon wafer and is bonded to the base substrate 12 with a first oxide film 21 therebetween. The first oxide film 21 is an electrically insulating silicon oxide film ($SiO_2$ film) which is formed not only in the top side of the active layer 13, but on all sides thereof, including also the back side and lateral sides. The above oxide film is not formed in the base substrate 12. The surface (top side) of the active layer 13 is etched by selectively using only reactive radicals 28 (FIG. 2) generated by the subsequently described plasma etching process. The active layer 13 is formed with a thickness of 10 to 200 nm, and preferably 10 to 70 nm, and with a thickness variation throughout the active layer 13 of 1.5 nm or less, and preferably 1.0 nm or less. Here, the thickness of the active layer 13 is limited to a range of 10 to 200 nm because, at a thickness of less than 10 nm, the surface roughness tolerance, which is presumably about one-tenth the thickness of the active layer 13, would have to be set to 1 nm or less, which is not feasible with current plasma etching technology. Conversely, at a thickness of more than 200 nm, the surface roughness tolerance would be too large, making it impossible to achieve a uniform thickness in the active layer 13. The thickness variation throughout the active layer 13 is limited to 1.5 nm or less because, at a total thickness variation of more than 1.5 nm, device operation at individual chips in the plane of the SOI substrate 11 is unstable in a full depletion SOI device construction.

A method for manufacturing SOI substrates 11 having such a construction is described.

To begin with, a first oxide film 21 (an electrically insulating silicon oxide film, or "$SiO_2$ film") is formed by thermally oxidizing not just the top side, but all sides including the back side and the lateral sides, of an active layer-forming substrate 14 including a single-crystal silicon wafer (FIG. 1(a)). This first oxide film 21 is formed with a thickness of 100 to 300 nm, and preferably 120 to 160 nm. Here, the thickness of the first oxide film 21 is limited within a range of 100 to 300 nm because at less than 100 nm, the void eliminating effect that employs the fluidity of the oxide film at elevated temperatures in bonding treatment and bond strengthening treatment becomes small; thereby, facilitating void generation. Whereas at more than 300 nm, the buried oxide film has a uniformity that falls short of device requirements. By using chemical vapor deposition (CVD) rather than thermal oxidation, the first oxide film ($SiO_2$ film) may be formed only in the top side of the active layer-forming substrate. Next, hydrogen ions are implanted from the top side of the active layer-forming substrate 14 at a dose of $4 \times 10^{16}/cm^2$ to $10 \times 10^{16}/cm^2$ and an acceleration energy of 20 to 200 keV; thereby, an ion-implanted region 16 is formed within the active layer-forming substrate 14 (FIG. 1(b)). The dose of hydrogen ions is limited to a range of $4 \times 10^{16}/cm^2$ to $10 \times 10^{16}/cm^2$ because cleavage will not occur at a dose below $4 \times 10^{16}/cm^2$, whereas at above $10 \times 10^{16}/cm^2$, self-cleavage arises on the top side of the active layer-forming substrate 14 during hydrogen ion implantation, and the generation of particles is facilitated. The acceleration energy is limited to a range of 20 to 200 keV because at below 20 keV, the active layer becomes too thin when the amount of material removed by plasma etching is 100 nm or more, and at above 200 keV, a special ion implanter is required. A base substrate 12 including a single-crystal silicon wafer having the same surface area as the above active layer-forming substrate 14 is separately furnished (FIG. 1(c)). The above-described oxide film is not formed in this base substrate 12. The above active layer-forming substrate 14 is overlaid onto and brought into contact with the base substrate 12, with the first oxide layer 21 therebetween (FIG. 1(d)). These substrates 12 and 14 are then held in this state within a nitrogen atmosphere at 400 to 800° C., and preferably 450 to 600° C., for 1 to 30 minutes, and preferably 10 to 30 minutes, to carry out the first heat treatment. This heat treatment causes the active layer-forming substrate 14 to crack in the ion-implanted region corresponding to the hydrogen ion implantation peak positions and split into an upper thick portion 17 and a lower thin active layer 13 (FIG. 1(e)); thereby, a bonded substrate is formed in which the lower active layer 13 is in contact with the base substrate 12, with the first oxide film 21 therebetween (FIG. 1(f)).

Next, the thickness variation throughout the active layer 13 of the bonded substrate 18 is measured with a film thickness gauge. The film thickness gauge employs a halogen lamp as the light source and includes a filter unit which uses a narrow-band filter with a range of 0.4 to 0.9 μm to irradiate the bonded substrate, a sensor that batch processes the entire bonded substrate with a 1024×1024 pixel CCD camera, a library of previously prepared reflectance spectrum curves, and an arithmetic unit having merit functions which compare this library with the reflectance spectra at each of the wavelengths captured. Light at the various wavelengths which passes through a filter wheel from the halogen lamp is magnified by a light-collecting mirror and irradiated onto the surface of the bonded substrate. Polarization of the irradiated light and image formation on the bonded substrate can be avoided by arranging for the light to impinge vertically on the substrate. The reflected light-collecting unit is made slightly larger than the diameter of the bonded substrate for clearly capturing up to the peripheral edge of the bonded substrate.

By measuring the thickness of the active layer 13 using the above film thickness gauge, the variation in the thickness of the active layer 13 can be determined. When the thickness of the active layer 13 is measured, the thickness variation throughout the active layer 13 is determined from the center of the active layer 13 to the periphery of the active layer 13. That is, letting the radius of the active layer 13 be R and the ring width at the periphery where the film thickness is not measured be t, the thickness is measured up to a radius of (R-t) in the active layer 13. The ring width t is from 1 to 3 mm, and preferably from 1 to 2 mm.

Figure 2:
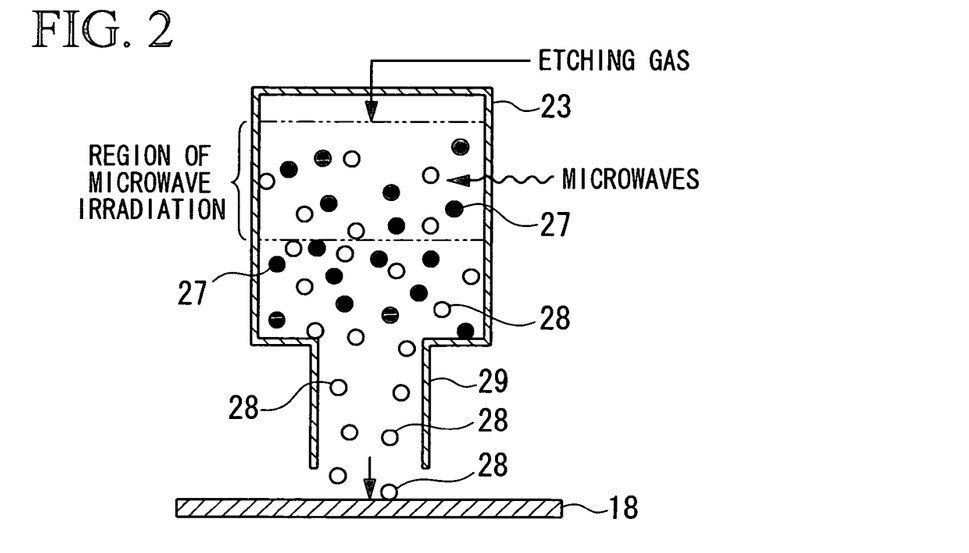
FIG. 2 is a cross-sectional diagram illustrating the principle of the plasma etching process.
Figure 3:
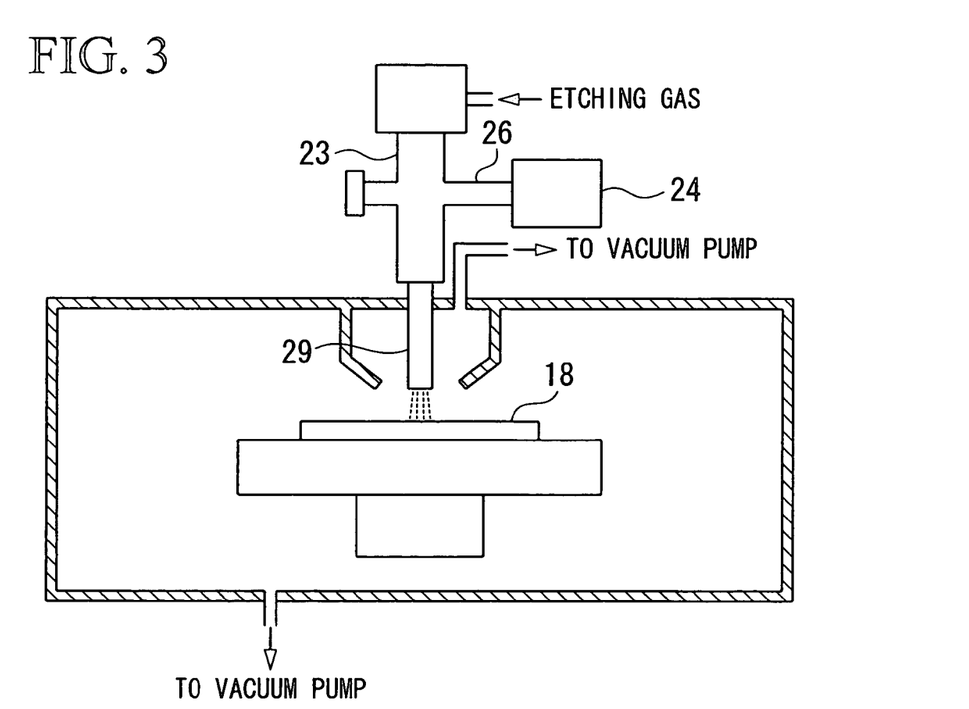
FIG. 3 is a cross-sectional diagram of a plasma etching apparatus.

After the thickness of the active layer 13 has been measured, based on the film thickness data, a plasma etching process is used to etch away a lot of material in areas where the film thickness is large and to etch away a little material in areas where the thickness is small (FIG. 1(h)). As shown in FIGS. 2 and 3, this plasma etching process is a dry chemical planarization (DCP) process in which etching gases such as $SF_6$, $Ar/H_2$, $N_2$ and $O_2$ are introduced into a radial tube 23. At the same time microwaves having a frequency of 2.45 GHz generated by a microwave generator 24 are guided through a waveguide 26 to the above radial tube 23. The etching gases are converted into a plasma by the microwaves; thereby, reactive ions 27 and reactive radicals 28 are generated. Localized etching of the surface of the active layer 13 is carried out by discharging only the reactive radicals 28 as the etchant from a spray nozzle 29.

For example, by using $SF_6$ as the etching gas and decomposing and activating this $SF_6$ with microwaves, as shown in the following reaction formula (1), reactive ions 27 such as $SF_x$ and $F^-$ (fluoride ions), and reactive radicals 28 composed only of neutral radicals F* are generated.

$$SF_6 \rightarrow SF_x + F^- + F^* + \quad (1)$$

Of the reactive ions 27 and the reactive radicals 28, if only the reactive radicals 28 are locally sprayed onto predetermined areas at the surface of the active layer 13, etching is effected solely by chemical reactions like that indicated by the following formula (2).

$$Si + 4F^* \rightarrow SiF_4 \uparrow \quad (2)$$

In order to separate the reactive ions 27 from the reactive radicals 28 and discharge only the reactive radicals 28 from the spray nozzle 29, characteristics of the inability of the reactive ions 27 to exist over a long distance relative to the reactive radicals 28 is used and the region where the plasma is generated by microwaves is placed at a distance on the upstream side from the tip of the spray nozzle 29.

Such an arrangement enables the discharge of reactive radicals 28 alone. In contrast with a prior-art plasma etching process which uses the reactive ions 28 as the main etchant and which causes physical damage to the surface of the active layer 13 due to the reaction ions 28, a plasma etching process which uses as the etchant only reactive radicals 28 etches by means of chemical reactions and thus does not damage the surface of the active layer 13.

Figure 4:
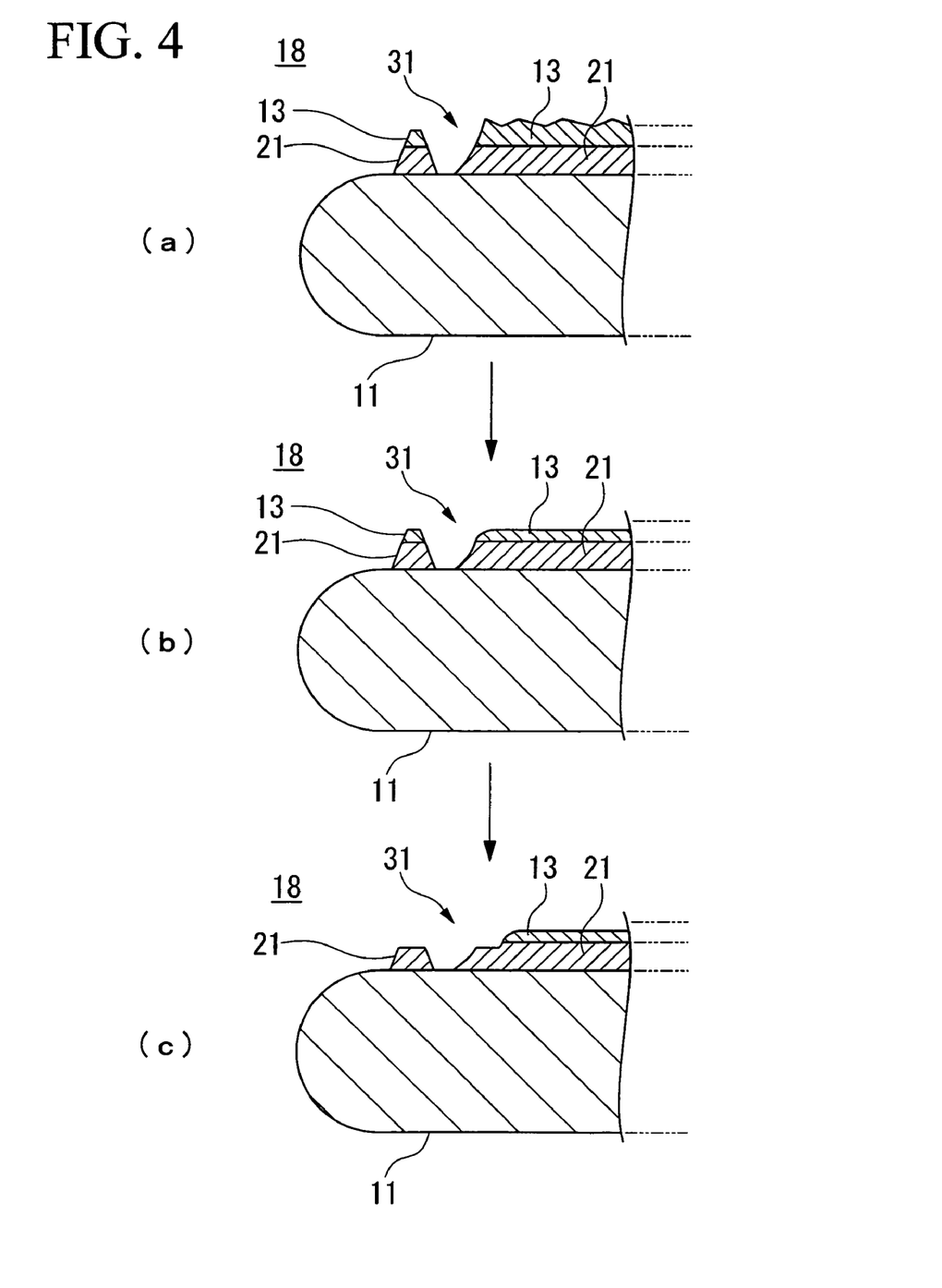
FIG. 4 is a diagram showing a step in which, after plasma etching of the SOI substrate based on active layer thickness measurement data, the boundary area between the inactive region and the active region is plasma etched.

As shown in FIG. 4, with regard to the plasma etching of a boundary area 31 between an active region and an inactive region at the peripheral edge of the bonded substrate 18, instead of etching that involves the feedback of data from the film thickness gauge, other conditions are set so as to enable the etching of a ring-like region in a range of 1 to 3 mm inward from the edge of the bonded substrate 18 and, depending on the shape of the bonded substrate 18, very small, island-shaped or peninsular active regions present within the ring-like region in a range of 1 to 2 mm inward from the edge of the bonded substrate 18. That is, after etching has been carried out by a plasma etching process based on the film thickness data for the active layer 13 (FIG. 4(b)), the boundary area 31 between the active region and the inactive region at the peripheral edge of the bonded substrate 18 is plasma etched by a thickness equal to that of the active layer 13 prior to plasma etching based on film thickness measurement data (FIG. 4(*c*)). As shown in FIG. 4(*c*), this plasma etching completely exposes island-like or peninsular areas of the first oxide film 21, but because this first oxide film 21 has a very low etch rate compared with the etch rate for the active layer 13, the first oxide film 21 is substantially not etched during plasma etching of the boundary area 31. This first oxide film 21 in the form of islands or peninsulas is removed by etching together with the second oxide film during immersion in the subsequently described cleaning solution.

Next, a second heat treatment is carried out in which the bonded substrate 18 having a planarized surface is held in an atmosphere of oxygen, nitrogen, argon or a mixed gas thereof at 900 to 1200° C., and preferably 1000 to 1150° C., for 30 to 180 minutes, and preferably 60 to 120 minutes; thereby, the bond between the active layer 13 and the base substrate 12 with the first oxide film 21 therebetween is strengthened (FIG. 10)). The temperature of the second heat treatment is limited to a range of 900 to 1200° C. because at below 900° C., a sufficient bond strength is not obtainable at and at above 1200° C., slip tends to arise. The second heat treatment is limited to a range of 30 to 180 minutes because a sufficient bond strength is not obtainable at less than 30 minutes, whereas at more than 180 minutes, a sufficient bond strength has already been obtained and further extension of the heat treatment period needlessly lowers the production efficiency.

In addition, the second heat treatment forms a second oxide film 22 on the back side and lateral face of the bonded substrate 18, as well as the surface of the active layer 13. By immersing this bonded substrate 18 into a cleaning solution, the second oxide film 22 are etched and removed and the bonded substrate 18 is cleaned. The cleaning solution is preferably one containing more than 0.1 wt % and 50 wt % or less, and preferably from 0.2 to 10 wt %, of organic acid, and containing from 0.005 to 0.25 wt %, and preferably from 0.005 to 0.10 wt %, of hydrofluoric acid. Illustrative examples of the organic acid include one or more selected from among citric acid, succinic acid, ethylenediaminetetraacetic acid, tartaric acid, salicylic acid, oxalic acid, acetic acid and formic acid. The reason for limiting the organic acid concentration to more than 0.1 wt % and 50 wt % or less is as follows. At 0.1 wt % or less, too little organic acid is present, which makes it impossible for free metal impurities within the cleaning solution to form complexes with organic acid molecules, as a result of which metal impurities on the second oxide film 22 redeposit on the surface of the active layer 13. On the other hand, at more than 50 wt %, the amount of fine particles on the second oxide film 22 which redeposit on the surface of the active layer 13 increases. The hydrofluoric acid concentration is limited to a range of 0.005 to 0.25 wt % because at below 0.005 wt %, the second oxide film 22 splitting effect at the surface of the active layer 13 is poor. On the other hand, at above 0.25 wt %, the cleaning solution becomes a strong acid having a pH below 2, which inhibits dissociation of the organic acid within the cleaning solution and lowers the complexing action thereof. Moreover, the fine particles acquire a positive surface potential, as a result of which they redeposit on the surface of the active layer 13. When the bonded substrate 18 that has been subjected to the second heat treatment is immersed in the above-described cleaning solution, the second oxide film 22 is removed by the hydrofluoric acid (HF) and fine particles and metal impurities on this second oxide film 22, as well as metal impurities contained within the second oxide film 22, migrate into the cleaning solution.

Because the cleaning solution is an acidic solution with a pH of 4 or below that contains from 0.05 to 0.25 wt % of hydrochloric acid and more than 0.1 wt % and 50 wt % or less of organic acid, like the surface of the active layer 13, the surfaces of the fine particles are negatively charged. Furthermore, the free metal impurities in the solution form a complex with the organic acid molecules, becoming a metal complex salt. The complex ions in this metal complex salt are negative ions. As a result, the fine particles and metal impurities each have surface potentials which, like the surface potential of the active layer 13, are negative, thus deposition or re-deposition on the active layer 13 are prevented. When the active layer 13 is drawn out of the cleaning solution, a cleaned SOI substrate 11 is obtained (FIG. 1(*k*)).

The hydrogen ion implantation depth (implantation peak position) into the active layer-forming substrate 14 is selected while taking into account the thickness of the first oxide film 21 (50 to 300 nm, and preferably 100 to 200 nm), the etching depth by cleaning (5 nm or less, and preferably 1 nm or less), the thickness of the second oxide film 22 (50 to 300 nm, and preferably 100 to 200 nm), and the etching depth by the plasma etching process (100 to 300 nm, and preferably 150 to 250 nm). The etching depth by the plasma etching process is limited to a range of 100 to 300 nm because at below 100 nm, splitting damage cannot be removed even with subsequent intense heat treatment, nor can an improvement in planarity be expected. On the other hand, at above 300 nm, etching by the plasma etching process takes too long, lowering the production efficiency, in addition to which a large amount of reaction product is generated. In a separate operation, the splitting plane on the thick portion 17 is planarized by a polishing process or the like (FIGS. 1(*g*) and 1(*i*)). This enables the thick portion 17 to be used as a new active layer-forming substrate 14 or base substrate 12 in the manufacture of another SOI substrate 11.

In a SOI substrate 11 manufactured in this way, because the surface of the active layer 13 is etched based on the thickness of the active layer 13 by selectively using only reactive radicals 28 generated by a plasma etching process, the surface of the active layer 13, that is, the crystal defect layer at the splitting plane created in the ion-implanted region 16 by the first heat treatment, can be removed. Moreover, the thickness variation of the active layer 13 can be reduced and the active layer 13 rendered to a uniform thickness without damaging the surface of the active layer 13.

EXAMPLES

Examples of the invention and comparative examples are described below.

Example 1

As shown in FIG. 1, first an active layer-forming substrate 14 made of a single-crystal silicon wafer and having a diameter and thickness of 200 mm and 0.725 mm, respectively, was held in an oxygen atmosphere at 1000° C. for 5 hours so as to carry out a heat treatment; thereby a first oxide film 21 was formed not only in the top side of the active-forming substrate 14, but also in the back side and lateral face thereof. This first oxide film 21 had a thickness of about 150 nm. Next, hydrogen ions were implanted at a dose of $6 \times 10^{16}/cm^2$ and an acceleration energy of 50 keV from the surface of the active layer-forming substrate 14; thereby an ion-implanted region 16 was formed within the active layer-forming substrate 14 (FIG. 1(*b*)). The depth (implantation peak position) of this ion-implanted region 16 was set to about 500 nm, including the above first oxide film 21. A base substrate 12 which was made of a single-crystal silicon wafer and which had the same surface area as the above active layer-forming substrate 14 and a thickness of 0.725 mm was separately furnished (FIG. 1(c)). The active layer-forming substrate 14 was overlaid onto and brought into contact with the base substrate 12, with the first oxide layer 21 therebetween (FIG. 1(d)). These substrates 12 and 14 were held in this state for 30 minutes in a nitrogen atmosphere at 500° C., thereby carrying out a first heat treatment. As a result, the active layer-forming substrate 14 cracked in an ion-implanted region 16 corresponding to the hydrogen ion implantation peak position, and split into an upper thick portion 17 and a lower thin active layer 13 (FIG. 1(e)); thereby, a bonded substrate was formed in which the lower active layer 13 was in contact with the base substrate 12 with the first oxide film 21 therebetween (FIG. 1(f)).

Next, the film thickness throughout the active layer 13 of this bonded substrate 18 was measured with a film thickness gauge. The film thickness throughout the active layer 13 was measured within a region extending from the center of the active layer 13 to a position 2 mm inside the peripheral edge of the active layer 13. That is, because the active layer 13 had a radius of 100 mm and the peripheral ring width where the film thickness is not measured was 2 mm, the film thickness was measured in a region that extended up to a radius of 98 mm on the active layer 13. After the thickness of the active layer 13 had been measured, the reactive radicals 28 (FIG. 2) alone that generated by the plasma etching process were selectively used to etch away a lot of material where the active layer had a large thickness and etch away a little material where the active layer had a small thickness, based on the above film thickness data; thereby, the active layer 13 was etched to a predetermined thickness (FIG. 1(h)). The maximum etching depth at this time was 202 nm, and the minimum etching depth was 199 nm. In addition, the boundary area between the inactive region and the active region at the peripheral edge of the bonded substrate 18 was etched by a thickness substantially equal to that of the active layer 13 prior to plasma etching based on film thickness measurement data. That is, etching was carried out to an etching depth of 400 nm (FIGS. 4(b) and 4(c)).

The above-described bonded substrate 18 on which the film thickness had been rendered uniform was then held in an oxygen atmosphere at 1100° C. for 120 minutes to carry out a second heat treatment; thereby, the bond between the active layer 13 and the base substrate 12 with the first oxide film 21 therebetween was strengthened (FIG. 1(j)). This bonded substrate 18 was immersed in a cleaning solution so as both to etch away and remove the second oxide film 22 formed by the second heat treatment, and also to clean the bonded substrate 18; thereby, a cleaned SOI substrate 11 (FIG. 1(k)) in accordance with Example 1 of the present invention was yielded. The cleaning solution used here contained 0.5 wt % of citric acid as the organic acid and 0.01 wt % of hydrofluoric acid. After cleaning, the active layer 13 had a thickness of 50 nm.

Comparative Example 1

Aside from using a chemical mechanical polishing instead of plasma etching process, a SOI substrate was manufactured in the same way as in Example 1; thereby, a SOI substrate according to Comparative Example 1 was yielded.

(Comparative Testing and Evaluation)

The thickness variations in the active layer on the SOI substrates obtained in Example 1 and Comparative Example 1 were measured. The thickness variation in Comparative Example 1 was large at 5.0 nm, but was only 1.5 nm in Example.

Optical microscopic examination of the boundary area between the inactive region and the active region in Example 1 of the present invention showed that the small, island-like or peninsular active regions were gone and a smooth boundary had formed.

INDUSTRIAL APPLICABILITY

The method for manufacturing an SOI substrate of the present invention enables the variation in the thickness of the active layer to be reduced and the thickness of the active film to be made more uniform without damaging the surface of the active film.

Furthermore, by adding to the etching process, a step in which the boundary area between the inactive region and the active region at the peripheral edge of the bonded substrate is additionally plasma etched by a thickness equal to that of the active layer prior to plasma etching based on film thickness measurement data, the boundary line between the inactive region and the active region can be made smooth without increasing the number of processing operations. As a result, particle generation can be suppressed.

Accordingly, the present invention makes it possible to provide SOI substrates having an active layer with minimal variation in the film thickness, and thus a more uniform active layer thickness, with substantially no damage to the surface of the active film.

The invention claimed is:

1. A method for manufacturing a silicon-on-insulator (SOI) substrate, comprising:
   forming an oxide film in at least a surface of an active layer-forming substrate including a single-crystal semiconductor;
   implanting hydrogen ions from the surface of the active layer-forming substrate so as to form an ion-implanted region within the active layer-forming substrate;
   subjecting the active layer-forming substrate to a first heat treatment in a state in which the active layer-forming substrate contacts, through the oxide film, with a base substrate including a single-crystal semiconductor so as to separate the active layer-forming substrate from the base substrate at the ion-implanted region and form an active layer on a surface of the base substrate, thereby, forming a bonded substrate;
   measuring film thickness throughout the active layer;
   selectively using only reactive radicals generated by a plasma etching process to etch more material at the surface of the active layer in areas where the active layer has a large thickness and etch less material at the surface of the active layer in areas where the active layer has a small thickness based on the film thickness data obtained by the above measurement, in such a way as to etch off at least 100 nm of the active layer and thin the active layer to a predetermined thickness;
   additionally plasma-etching a boundary area between an inactive region and an active region at the periphery of the bonded substrate by a thickness equal to that of the active layer prior to plasma etching, based on the film thickness data; and
   subjecting the plasma-etched bonded substrate to a second heat treatment so as to enhance the bond strength.

2. The method for manufacturing a SOI substrate according to claim 1, wherein the film thickness throughout the surface of the active layer is measured from the center of the active layer to the periphery of the active layer.

3. The method for manufacturing a SOI substrate according to claim 1, wherein the film thickness throughout the surface of the active layer is measured within a radius of (R-t) in the active layer;

wherein R is a radius of the active layer and t is a ring width at the periphery where the film thickness is not measured; and t is from 1 to 3 mm.

4. The method for manufacturing a SOI substrate according to claim 1, wherein the thickness variation throughout the active layer after plasma etching is 1.5 nm or less.

5. The method for manufacturing a SOI substrate according to claim 1, wherein the method further comprises a cleaning step in which the bonded substrate having an oxide film formed in the surface of the active layer by the second heat treatment is immersed in a cleaning solution so as to remove the oxide film, and then particles and metal are removed.

6. The method for manufacturing a SOI substrate according to claim 1, wherein the first heat treatment comprises holding the active layer-forming substrate in a nitrogen atmosphere at 400 to 800° C. for 5 to 30 minutes, and the second heat treatment comprises holding the bonded substrate in an atmosphere of oxygen, nitrogen, argon or a mixed gas thereof at 900 to 1200° C. for 30 to 120 minutes.

7. The method for manufacturing a SOI substrate according to claim 6, wherein the method further comprises a cleaning step in which the bonded substrate having an oxide film formed in the surface of the active layer by the second heat treatment is immersed in a cleaning solution so as to remove the oxide film, and then particles and metal are removed.

* * * * *